United States Patent [19]
Scheiter et al.

[11] Patent Number: 5,662,772
[45] Date of Patent: Sep. 2, 1997

[54] METHOD FOR THE SELECTIVE REMOVAL OF SILICON DIOXIDE

[75] Inventors: Thomas Scheiter; Ulrich Naeher; Christofer Hierold, all of Munich, Germany

[73] Assignee: Siemens Aktiengesellschaft, Munich, Germany

[21] Appl. No.: 637,237

[22] Filed: Apr. 24, 1996

[30] Foreign Application Priority Data

Apr. 28, 1995 [DE] Germany ............. 195 15 796.6

[51] Int. Cl.$^6$ .................. H01L 21/00; C03C 15/00
[52] U.S. Cl. .................. 216/2; 216/79; 216/75; 438/743; 438/935
[58] Field of Search .............. 156/646.1, 651.1, 156/656.1, 657.1; 134/1.3

[56] References Cited

U.S. PATENT DOCUMENTS

| | | | |
|---|---|---|---|
| 4,749,440 | 6/1988 | Blackwood et al. | 156/646 |
| 5,022,961 | 6/1991 | Izumi et al. | 156/646 |
| 5,167,761 | 12/1992 | Westendorp et al. | 156/646 |
| 5,174,855 | 12/1992 | Tanaka | 156/626 |
| 5,294,568 | 3/1994 | McNeilly et al. | 437/235 |

FOREIGN PATENT DOCUMENTS

WO90/10729  9/1990  WIPO.

OTHER PUBLICATIONS

D. Syverson, "An Advanced Dry/Wet Cleaning Process for Silicon Surfaces", Technical Report DC/R/D, TR 369, Jun. 1, 1991, FSI International, pp. 1–7.

Primary Examiner—R. Bruce Breneman
Assistant Examiner—Michael E. Adjodha
Attorney, Agent, or Firm—Hill, Steadman & Simpson

[57] ABSTRACT

In a method for the selective removal of $SiO_2$ relative to semiconductor materials and/or metal, a specimen to be processed and containing $SiO_2$ is placed into a chamber having at least one gas admission opening and one gas outlet opening. Using controllable valves at the gas admission opening, dosed quantities of hydrogen fluoride gas and water vapor are admitted into the chamber. These gasses proceed to the $SiO_2$ in a specimen in a quantity adequate for etching. However, the quantities of these gasses are limited such that a condensation of the water vapor to form liquid water on the specimen during the etching event is avoided. An etching event is then implemented. Water vapor that arises as a reaction product during the etching is eliminated through the gas outlet opening before the occurrence of condensation and, simultaneously, an inert gas is admitted into the chamber through the gas admission opening. These steps are repeated as needed.

14 Claims, 1 Drawing Sheet

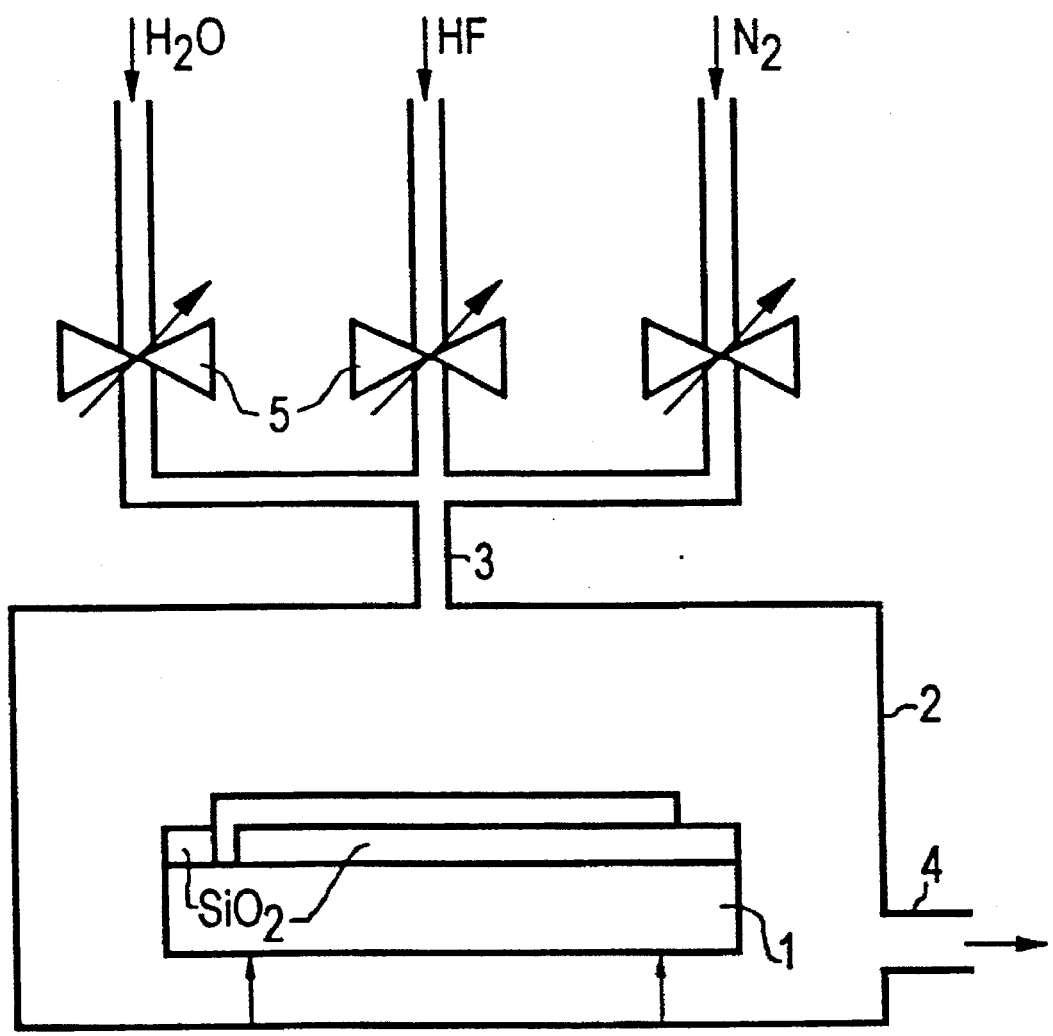

METHOD FOR THE SELECTIVE REMOVAL OF SILICON DIOXIDE

BACKGROUND OF THE INVENTION

The present invention is directed to a method for the selective etching of $SiO_2$ layers, particularly for selective removal of sacrificial layers relative to metallizations.

when etching free micromechanical structures with a sacrificial layer, disadvantages in the prior art are that, the micromechanical structure remains adhering to the surface of the chip after the wet etching fluid has dried and that the etchant used for the etching cannot be used selectively relative to, for example, aluminum. In wet-chemical etching, the liquid etchant is subsequently removed from the surface of the etched chip with what is also a liquid chemical. This chemical is then removed in that it is converted into the gaseous aggregate state, so that the structure that has been etched free does not remain adhering to the surface of the chip. When micromechanical structures are to be realized from, for example, a metal (for example, a metallization of aluminum), then a sacrificial layer of silicon dioxide cannot be selectively removed relative to the metal with the hydrofluoric acid (hydrogen fluoride in aqueous solution), which is usually employed as etchant, because the metal would also be attacked and decomposed by the hydrofluoric acid. Metallizations of aluminum such as, for example, terminal contacts or interconnects must therefore, for example, be protected against the etching attack with complicated measures before the etching with hydrofluoric acid. This can occur, for example, by applying resist masks. In the manufacture of micromehanical structures that are not composed of silicon, materials other than silicon dioxide must therefore be used for sacrificial layers. The employment of etchants other than hydrofluoric acid is very involved and is also not compatible with the standard manufacturing processes. An improved etching process with HF was presented in 1991 by D. Syverson at the Institute of Environmental Sciences as FSI Technical Report 369.

SUMMARY OF THE INVENTION

It is an object of the present invention to provide a method for semiconductor technology with which $SiO_2$ can be selectively removed, particularly relative to metal such as, for example, aluminum, without great additional outlay.

In general terms the present invention is a method for selective removal of $SiO_2$ relative to semiconductor materials and/or metal in a specimen. A specimen to be processed and containing $SiO_2$ is placed into a chamber having at least one gas admission opening and one gas outlet opening. Controllable valves are used at the gas admission opening, for admitting dosed quantities of hydrogen fluoride gas and water vapor into the chamber. These gasses proceed to the $SiO_2$ in the specimen in a quantity adequate for an etching. However, the quantities of the gasses are limited such that a condensation of the water vapor to form liquid water on the specimen during the etching event is avoided. An etching event is then implemented. Water vapor that arises as reaction product during the etching is eliminated through the gas outlet opening before the occurrence of condensation and, simultaneously, an inert gas is admitted into the chamber through the gas admission opening. These steps are repeated as needed.

The following are advantageous developments of the present invention.

Nitrogen is employed as the inert gas.

Controllable valves are used that are provided with mass flowmeters, and the gas quantities flowing through these valves are electronically regulated.

The method is used for the selective etching of $SiO_2$ relative to silicon or metal on semiconductor components.

The method is used for etching movable micromechanical function elements of polysilicon free.

The method is used for etching free micromechanical function elements of aluminum.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

The single FIGURE depicts apparatus for implementing the method of the present invention.

DESCRIPTION OF THE PREFERRED EMBODIMENTS

In the inventive method, the etching occurs upon employment of hydrogen fluoride in the gaseous aggregate state, that is using a dry etching process. In order to enable the etching, the water required for the chemical conversion is also introduced in a gaseous aggregate state, that is, as water vapor. The relevant, simplified reaction equation for the etching of the silicon dioxide is:

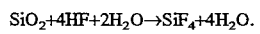

$$SiO_2 + 4HF + 2H_2O \rightarrow SiF_4 + 4H_2O.$$

It may be derived from this equation that water is required in order to start the reaction, and that water is also an end product of the chemical conversion. The amount of water present therefore increases during the course of the etching process.

In the inventive method, water vapor is first made available in an adequate amount so that the etching reaction can begin. The amount of water vapor, however, is limited such that there is no condensation of the water vapor that would form liquid water. Since more water arises during the etching, the occurrence of such a high saturation with water vapor that water drops eventually precipitate on the chip being processed cannot be prevented during the course of the etching process inside of a chamber in which the etching occurs. In this method, the etching process is therefore terminated in time in that the gasses present in the chamber are let off through a gas outlet and the chamber and, thus, the surface of the chip being etched are rinsed with an inert gas such as, for example, nitrogen.

This method can be implemented, for example, in the apparatus schematically shown in the single FIGURE. The specimen 1 to be processed, for example a semiconductor component provided with a micromechanical structure on an $SiO_2$ layer, is placed into the chamber or chamber 2. This chamber has a gas admission opening 3 and a gas outlet opening 4. The gasses $H_2O$, HF and, for example, $N_2$ required for the process are respectively admitted into the chamber 2 via the gas admission opening 3. Controllable valves 5 are built in for the dosing of these gasses. These valves 5 can be connected to a mass flowmeter that determines the amount of gas flowing through and automatically opens or closes the valves, for example program-controlled, potentially via an electronic control means. The water vapor can come, for example, from an evaporator. HF and $N_2$ are introduced from, for example, connected gas bottles. Arrangements having, for example, three separate gas admission openings for the gasses used can be employed instead of the illustrated apparatus.

The erosion of the $SiO_2$ layer from the specimen being processed ensues inventively by multiply repeated, short etching processes. First, water vapor and gaseous hydrogen fluoride are admitted into the chamber 2 in the relationship required for the etching. The quantity of water vapor and the reaction rate, however, are thereby limited such that no condensation occurs. The etching attack onto the $SiO_2$ then ensues. During the course of the etching process, more water vapor arises in conformity with the above reaction equation. The etching must ensue with a minimum etching rate (speed of the etching process) because the process otherwise becomes unstable. A maximum etching rate is established by the physical conditions. The etching duration within the range possible for the etching rate must not be selected so long, that water drops precipitate on the etched surface. The etching process is terminated before a critical concentration of the water vapor is reached, that is saturation of the gas in the chamber with water vapor whereat a condensation of the water would then occur, and the gasses present in the chamber 2 are let off through the gas outlet opening 4. This occurs in that an inert gas such as, for example, nitrogen, is admitted into the chamber through the gas admission opening and the other gasses are displaced out of the chamber 2 in this way. After all of the water vapor has been removed from the chamber or the concentration of the water vapor in the gas in the chamber has been at least adequately lowered, a new etching process is begun by admitting HF and, potentially, water vapor into the chamber through the gas admission opening 3. The etching can be implemented to the intended extent by repeating these individual segments of the etching process. An under-etching of structures that extends a number of micrometers under these structures can therefore be achieved without having to fear that a liquid will precipitate on the etched surface and that the problem of adhesion will subsequently arise.

A more detailed description of the method and expedient embodiments thereof are recited below. A cylindrical etching chamber in which the wafer to be processed is seated on three points with its surface facing up is employed as chamber. A controlled inflow of the gasses employed can be set using three mass flow controllers (MFCs). The MFCs employed are provided, for example, for the following, maximum flow rates:

| | |
|---|---|
| MFC 1 ($N_2$ as carrier gas): | 30.0 l/min |
| MFC 2 ($N_2$ enriched with $H_2O$): | 2.0 l/min |
| MFC 3 (HF gas): | 0.5 l/min |

The degree of enrichment of the nitrogen with water (MFC 2) amounts to about 1%.

The volume is constantly rinsed with nitrogen that serves, among other things, to dilute the hydrogen fluoride and eliminate the reaction products (water and $SiF_4$). For etching, the nitrogen is mixed with HF gas. The maximum HF concentration lies at about 1.6% of the nitrogen quantity. Water vapor can be admitted into the chamber in addition to the HF gas (for example, a maximum of 0.3 $cm^3/s$, thus an absolute air humidity of about 0.001 volume % on average).

A pressure of about 1 bar, for example, prevails in the chamber at a temperature of, for example, 24° C. Since the pressure is kept constant, the outflowing gas quantity corresponds to the gas quantity admitted overall, this being largely established by the nitrogen.

In order to recite the water and the HF concentration as a function of time, it is assumed that no etching occurs and that the inflowing quantity of the respective gas is prescribed and the outflowing quantity of gas is established by the momentary concentration of this gas in the chamber and by the overall exchange rate. The following, for example, is valid for the HF concentration:

$$\frac{dn}{dt} = \frac{N_L}{V_K} \phi_{HF} - \frac{n}{V_K} \cdot \phi_{ges} \text{ with}$$

$n=1/m^3$ (plurality per volume),
$\phi = m^3/s$ (particle flow)
$V_m = 22.4$ $m^3/kmol$ (mol volume),
$N_A = 6.022 \cdot 10^{26}/kmol$ (Avogadro constant),
$N_L = N_A/V_m = 2.688 \; 10^{25}/m^3$,
$V_K = 3.4 \cdot 10^{-4}$ $m^3$ (volume of the chamber),
$N = N_L V_K$ (total number of gas atoms/molecules).

The solution of the differential equation is $$n(t) = N_L \phi_{HF}/\phi_{ges} \cdot (1 - \exp(-\phi_{ges} \cdot t/V_K)).$$

After a time of about $2 \cdot V_K/\Phi_{ges}$, an equilibrium of the concentration is therefore established, whereby this time is independent of the admitted HF quantity. The water concentration is in equilibrium exactly as fast as the HF concentration. Given maximum rinsing flow of the carrier gas, it can be assumed that, without etching, the gas mixture in the chamber has stabilized after a time of about 1.5 s.

The delivery of the gasses as well as the control of the mass flow controllers is possible using a process control computer. The etching process can thereby be divided into individual segments such as, for example, rinsings and etchings. The process sequence employed in this exemplary embodiment has the form:

1. Initialization (admission of $N_2$, rinsing for displacing the air in the chamber),
2. Stabilization (admission of $N_2$, without etching gas, but with the flow rate provided during the etching),
3. Pre-treatment (admission of $N_2$ and $H_2O$, possibility of supplying moisture for saturating the wafer surface with $H_2O$),
4. Etching (admission of $N_2$ and HF in the presence of $H_2O$, actual etching),
5. Termination (admission of $N_2$, admission of $N_2$ without HF for the defined ending of the etching), and
6. Rinsing (addition of $N_2$, final rinsing step).

Typical values for the durations and gas flows, for example, are:

| Step | | Duration (s) | $N_2$ (% MFC) | Vap (% MFC) | HF (% MFC) |
|---|---|---|---|---|---|
| 1 | Initialization | 5 | 90 | 0 | 0 |
| 2 | Stabilization | 5 | 25 | 0 | 0 |
| 3 | Pretreatment | 10 | 25 | 50 | 0 |
| 4 | Etching | 12 | 25 | 0 | 70 |
| 5 | Termination | 5 | 40 | 0 | 0 |
| 6 | Rinsing | 5 | 90 | 0 | 0 |

Individual steps can be repeated as needed.

In order to obtain a more precise understanding of the sequencing reactions, it is necessary to divide the chemical process into individual sub-reactions. This is possible using the equations:

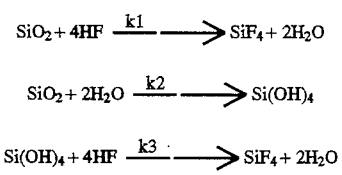

When no water is present during the etching, then the reaction sequences essentially according to the first equation, that is, the reaction coefficient $k_1$ defines the speed. Given addition of water vapor before the actual etching or, respectively, given an adequately fast etching (that is water as a reaction product is present in a sufficient amount), the reaction occurs catalytically according to the second and the third equation. The coefficients $k_2$ and $k_3$ now determine the speed, whereby $k_2, k_3 >> k_1$ applies. The etching of a sacrificial layer only by the reaction established in the first equation given, accordingly, extremely low etching rates is not possible because of the large under-etchings that are required.

The etching reaction does not begin immediately upon admission of HF gas into the chamber. A constant HF concentration is achieved in the chamber after about 1.5 s. Adequate water as catalyst of the etching reaction is not present at the etching surface at the beginning of the etching, and the commencement of the reaction is therefore additionally delayed by the reaction constant $k_1$. When the etching reaction has started, then adequate water for catalysis of the reaction arises due to the reaction, the etching accelerates, and a constant etching rate occurs. A pre-treatment with a mixture of nitrogen and water vapor makes it possible that the content of water vapor needed for starting the etching is already present at the beginning of the etching with HF gas. The pre-treatment should ensue with an optimally maximum introduction of water vapor. The carrier gas flow should thereby be equal to the gas flow during the etching step.

It is also possible to supply nitrogen enriched with water vapor during the etching. The quantity of water that can be supplied, however, is substantially less than the amount of water arising at the etched surface due to the reaction. Given adequate pre-treatment, the etching rate is largely independent of the amount of water additionally introduced during the etching. What is important for the execution of the etching is the concentration of the etching gas during the etching. A plurality of etchings with identical pre-treatments are implemented in order to determine this influence. The concentration of the carrier gas was first held constant during the etching and the amount of HF introduced was varied. An increase of the concentration of the reaction gas shortens the time until the etching begins and effects an increase in the etching rate. The concentration of the etching gas in the chamber, however, is not determined only by the inflow of HF but also by the amount of carrier gas flowing in. The etching rate depends on the ratio of the gas quantities of HF and $N_2$. The time until the beginning of the etching increases with increasing carrier gas flow and decreasing etching gas flow. It was observed that the etching is unstable, that is not reproducible below a specific minimum etching rate.

Under what conditions water drops form on the etched surface shall be described below using a diffusion model. A range for the critical process parameters in which etching can be carried out without water drops condensing on the etched surface and, thus, without sticking occurring can be theoretically calculated therefrom.

Inventively, the flow rate of the introduced HF gas and, thus, the reaction speed is controlled. Since water arises during the reaction, additional water introduction is only necessary until the reaction begins. The quantity of water arising at the etched surface per time unit during the reaction is proportional to the etching rate. In setting up the process parameters, care must be exercised to see that the etching rate does not exceed a specific limit, so that no formation of drops occurs. A layer of silicon oxide having a thickness of about 1 μm is converted into an approximately 2 μm thick water film by HF.

The partial pressure of the water vapor can be described as a function of the etching rate using a diffusion model, whereby it can be assumed by way of simplification that the diffusion represents the critical mechanism for the removal of the water arising during the reaction from the etched surface.

According to Fick's first law, the material transport is linked to the concentration gradient:

$$j = -D \, \text{grad} \, n,$$

where j is the particle current density, n is the particle density and D is the diffusion constant. That is, when the water arising due to the reaction immediately escapes as water vapor, a gradient of the particle density that corresponds to the flow density of the water vapor must occur directly at the surface. When it is assumed for reasons of symmetry that the gradient of the particle density resides perpendicularly on the surface to be etched (z-direction), $$dn/dt = D \, d^2 n/(dz)^2$$

results from Fick's second law.

It is assumed that the arising water is distributed by diffusion in the entire space above the etched surface. Measurements shows that the etching rate can be assumed to be constant during the etching process and the particle flow at the etched surface can therefore also be assumed to be constant. Given this condition, the concentration distribution at the etched surface is obtained as $$n(t) = 2j \, (t/\lambda D))^{+ \epsilon fra \, 1/2} + ee \, .$$

The critical etching rate that must not be exceeded during the etching, since a formation of drops would otherwise occur, is reached as soon as the water concentration at the etched surface corresponding to the vapor pressure in the chamber is exceeded. For any arbitrary etching rate R, this critical etching time $t_{krit}$ can be estimated according to the above physical considerations as $t_{krit} = \lambda D p_{vap}^2/(4n^2 R^2 k^2 T^2)$ with $D \approx 0.24$ cm$^2$/s (diffusion constant of water in air), $p_{vap}$ = vapor pressure of water, R = etching rate (in nm/s), $n = 2.3 \cdot 10^{22}$ cm$^{-3}$ (particle density of thermic silicon dioxide), $k = 1.38 \cdot 10^{-23}$ J/K (Boltzmann constant), and T = temperature in K.

The maximum etching duration thus decreases inversely proportional to the square of the etching rate.

At a greater distance from the etched surface, flows that occur also contribute to the transport of the particles in addition to the diffusion. A particle stream arises above the etched surface given constant admission of the carrier gas $N_2$ and of the reaction gas HF. The transport of the arising water is essentially limited in time by the exchange rate $t_1$ of the gas quantity in the chamber and by the time $t_2$ that is needed for the distribution by diffusion of the water vapor being released. Measurements show that $t_1 < t_2$ is valid.

Molecules are transported by flow (convection) or by diffusion. The flow becomes slower and slower toward surfaces, and a boundary layer forms thereat in which no convection occurs and the flow rate is low (laminar flow). Diffusion sees to the material transport in this boundary layer. Molecules that evaporate from the surface must first diffuse through the boundary layer before they are entrained by the flow. It can be assumed that a surface-proximate layer exists in which the material transport ensues exclusively by diffusion, and that a flow region exists thereabove in which the molecules are transported away relatively fast (with the time scale $t_1$).

For simplification, two boundary layer thicknesses are assumed: first, the layer thickness $\delta_s$ within which the flow rate of the gasses changes from 0 m/s at the surface to the value $v_o$, and, second, the layer thickness $\delta_c$ within which the water concentration has decreased from the value $n_s$ at the etched surface to a (negligibly small) value $n_o$. A plate flow parallel to the surface is assumed as a model. The thickness of the boundary layer of the laminar flow can be derived from general relationships between the viscosity, the flow rate and the spatial dimensions. The following is approximately valid for the thickness of a laminar boundary layer:

$$\delta_s = 5 \cdot (x\eta/v_o)^{tefra\ 1/2} + ee\ ,$$

where $\eta$ is the kinematic viscosity of the gas, $v_o$ is the velocity thereof in the flow region, and x is the spatial dimension in the plane of the plate. In the present model, the value $v_o = 0.1$ m/s approximately derives for the flow velocity from the exchange rate. The kinematic viscosity of nitrogen is $\eta = 1.32 \cdot 10^{-5}$ m²/s. With x=4 cm as example, $\delta_s = 1.2$ cm is approximately obtained for the layer thickness.

The velocity in the plane of the plate in x-direction as a function of the z-coordinate perpendicular to this plane is obtained as $$v_x(z) = v_o(1.5\ z/\delta_s - 0.5\ z^3/\delta_s^3),$$

that is, correctly, $v_x(0) = 0$. With $t_2 > t_1$, this corresponds to the assumption in the model that the stream of the arising water vapor is carried off so fast that the concentration of the water vapor outside of the diffusion layer drops off rapidly. The thickness of this diffusion layer is not identical to the thickness of the laminar boundary layer. It is also necessary to describe the diffusion flow in a layer with the thickness $\delta_c$ above a surface. Water vapor is constantly produced on this surface and is transported through the boundary layer by diffusion. It was assumed as a boundary condition that the concentration of water vapor has dropped to zero at the upper side of the layer.

In equilibrium (dn/dt=0), the concentration decreases linearly with the distance from the surface. The boundary conditions $n(z) = n_o$ for $z > \delta_c$ and $n(z) = n_s$ for $z = 0$ also apply. This yields:

$$n(z) = n_0 + (\delta_c - z) \cdot \nabla n = n_0 + \frac{(\delta_c - z)}{\delta_c} \cdot (n_s - n_0).$$

For the flow:

$$j = -D\nabla n = D\frac{n_s - n_0}{\delta_c}.$$

A direct relationship between the water vapor concentration at the surface and the etching rate is thus obtained. Given a thickness of the diffusion layer of 1.2 cm, an etching rate of, for example, 1 nm yields a water vapor concentration at the surface of $2.3 \cdot 10^{16}$ molecules/cm³. This concentration increases linearly with the etching rate. It corresponds to the pressure in the chamber given an etching rate of, for example, 1 nm/s. At etching rates of more than approximately 5 nm/s, this pressure becomes unimportant compared to the quantity of water produced by the reaction. Compared thereto, the maximally possible water vapor concentration (vapor pressure) at 20° C. amounts to $6.7 \cdot 10^{17}$ molecules/cm³. According to the above model, thus, formation of drops given full rinsing flow in equilibrium (long etching time given constant etching rate) is thus anticipated at etching rates above a critical etching rate (for example, given an etching rate of 30 nm/s). The critical etching rate is also dependent on the flowing quantity of the rinsing gas in the chamber. When the rinsing flow is lowered, then the thickness of the boundary layer increases. This increases the concentration of the water vapor at the etched surface and the formation of drops occurs earlier. It is not possible to vary the gas flow without changing the etching rate. If one wishes to retain the etching rate, the quantity of HF supplied must also be simultaneously increased. Even then, the water concentration decreases according to the above model.

The basis for the estimate undertaken here is the separation of diffusion and flow on the basis of the relationship $t_2 > t_1$. $t_2$ can be calculated from Fick's first law. A determining time unit of about 3 seconds is obtained for the diffusion. $t_2$ is therefore about twice as large as $t_1$.

For long times, the reaction proceeds in equilibrium and the finite thickness of the boundary layer must now be taken into consideration. The critical etching rate at which the water vapor concentration lies above the vapor pressure can be determined as in the case of equilibrium. This etching rate is now time-dependent. During short times, one can etch as fast as desired without drops being formed. The boundary layer must first be filled with water. Given maximum rinsing flow, for example, a critical etching rate of 60 nm/s is obtained after one second. The critical etching rate is 35 nm/s after three seconds.

The maximum etching rate is determined by the quantity of HF admitted (as an example, $2.1 \cdot 10^{20}$ molecules per second). When all molecules react, this corresponds to a maximum etching rate of 130 nm/s. $j = D\ n(\delta_c)/\delta_c$ is valid for the maximum flow of the HF gas through the boundary layer onto the surface. The diffusion constant of HF is approximately the same as that of water because of the molecule masses of about the same size. A flow onto the surface of $j = 9 \cdot 10^{16}$ cm²/s derives with an HF concentration of $4.3 \cdot 10^{17}$ molecules/cm³. This corresponds to a maximum etching rate of 10 nm/s. When the rinsing flow abates, this value rises.

Drop-free etching can be basically achieved in two ways. First, etching can be carried out with a moderate etching rate, whereby the etching process must be aborted before the critical etching time $t_{krit}$ is reached. The quantity of water that has arisen at the etched surface must be carried off by rinsing with nitrogen. This rinsing time required for this procedure can be calculated using the diffusion model. Since at most about 100 nm are eroded from the etched layer per etching step within the critical etching time, the etching must be implemented as a multiply interrupted etching with about 20 successive etching steps in the example. A second possibility is in implementing the etching in the stationary range, that is at low etching rates, but with an arbitrarily long etching duration. Due to the instability of the etching given low delivery of HF, a minimum etching rate cannot be downwardly transgressed. Due to the spatial inhomogeneity of the etching, a strict transition between a etched region in which sticking occurs and an etched region in which sticking does not occur does not necessarily derive.

By contrast to traditional dry etchings in plasma, the inventive method is therefore completely isotropic and is therefore especially suited for applications in surface micromechanics. Sensors or actuators wherein a movable part of, for example, metal such as, for example, aluminum or of polysilicon must be manufactured above a surface of semiconductor material or dielectric can thus be especially well manufactured.

Aluminum, for example, is decomposed by hydrogen fluoride in aqueous solution as a consequence of the interaction of corrosion and etching. Given hydrogen fluoride in the gaseous aggregate state as employed in the inventive method, no corrosion of aluminum occurs, so that existing structures of aluminum are not damaged or decomposed. Not only is the sticking of movable parts on the surface after the drying of a liquid prevented, a high selectivity of the etching of the SiO$_2$ relative to the metallization is also achieved. This method can therefore be advantageously employed in all manufacturing methods of semiconductor chips wherein metallizations are applied at SiO$_2$ must be etched subsequently thereto without damaging these metallizations. This is not possible in traditional, wet-chemical etching methods because of the inadequate selectivity.

In the inventive method, the gasses that are employed are separately dosed via the valves 5. It is therefore possible to adapt the method to the greatest variety of operating conditions such as, for example, the volume of the chamber, the expanse of the SiO$_2$ layers at which the etching attacks, the etching duration and the like. After the plurality and duration of the individual etching events have been determined, the method can be largely automated with an electronic control of the valves.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for selective removal of SiO$_2$ relative to semiconductor materials and/or metal on semiconductor components, comprising the steps of:

a) placing a semiconductor component containing SiO$_2$ into a chamber having at least one gas admission opening and one gas outlet opening;

b) admitting, using controllable valves at the gas admission opening, dosed quantities of hydrogen fluoride gas and water vapor into the chamber, so that said gas and said water vapor proceed to the SiO$_2$ in said semiconductor component in a quantity sufficient for etching, quantities of said gas and said water vapor being limited such that condensation of the water vapor, that forms liquid water on said semiconductor component during the etching event, is avoided;

c) implementing an etching event at the semiconductor component;

d) eliminating water vapor that arises as a reaction product during the etching of the semiconductor component through the gas outlet opening before occurrence of condensation and, simultaneously, admitting an inert gas into the chamber through the gas admission opening; and e) repeating steps b) through d) until the SiO$_2$ is selectively removed, movable micromechanical function elements of polysilicon thereby being etched free.

2. The method according to claim 1, wherein nitrogen is employed as the inert gas in step d).

3. The method according to claim 1, wherein controllable valves are employed in step b) that are provided with mass flowmeters, and gas quantities flowing through these valves are electronically regulated.

4. A method for selective removal of SiO$_2$ relative to semiconductor materials and/or metal on semiconductor components, comprising the steps of:

a) placing a semiconductor component containing SiO$_2$ into a chamber having at least one gas admission opening and one gas outlet opening;

b) admitting, using controllable valves at the gas admission opening, dosed quantities of hydrogen fluoride gas and water vapor into the chamber, so that said gas and said water vapor proceed to the SiO$_2$ in said semiconductor component in a quantity sufficient for etching, quantities of said gas and said water vapor being limited such that condensation of the water vapor, that forms liquid water on said semiconductor component during the etching event, is avoided;

c) implementing an etching event at the semiconductor component;

d) eliminating water vapor that arises as a reaction product during the etching of the semiconductor component through the gas outlet opening before occurrence of condensation and, simultaneously, admitting an inert gas into the chamber through the gas admission opening; and e) repeating steps b) through d) until the SiO$_2$ is selectively removed, micromechanical function elements of aluminum thereby being etched free.

5. The method according to claim 4, wherein nitrogen is employed as the inert gas in step d).

6. The method according to claim 4, wherein controllable valves are employed in step b) that are provided with mass flowmeters, and gas quantities flowing through these valves are electronically regulated.

7. A method for selective removal of silicon and/or metal on a semiconductor component, comprising the steps of:

a) placing a semiconductor component into a chamber having at least one gas admission opening and one gas outlet opening;

b) admitting, using controllable valves at the gas admission opening, dosed quantities of hydrogen fluoride gas and water vapor into the chamber, so that said gas and said water vapor proceed to the semiconductor component in a quantity sufficient for etching, quantities of said gas and said water vapor being limited such that condensation of the water vapor, that forms liquid water on said semiconductor component during the etching event, is avoided;

c) implementing an etching event at the semiconductor component;

d) eliminating water vapor that arises as a reaction product during the etching through the gas outlet opening before occurrence of condensation and, simultaneously, admitting nitrogen into the chamber through the gas admission opening; and e) repeating steps b) through d) until the silicon is selectively removed at the semiconductor component, the semiconductor component being movable micromechanical function elements of polysilicon are etched free.

8. The method according to claim 7, wherein controllable valves are employed in step b) that are provided with mass flowmeters, and gas quantities flowing through these valves are electronically regulated.

9. The method according to claim 7, wherein controllable valves are employed in step b) that are provided with mass flowmeters, and gas quantities flowing through these valves are electronically regulated.

10. A method for selective removal of silicon and/or metal on a semiconductor component, comprising the steps of:

a) placing a semiconductor component into a chamber having at least one gas admission opening and one gas outlet opening;

b) admitting, using controllable valves at the gas admission opening, dosed quantities of hydrogen fluoride gas and water vapor into the chamber, so that said gas and said water vapor proceed to the semiconductor component in a quantity sufficient for etching, quantities of said gas and said water vapor being limited such that condensation of the water vapor, that forms liquid water on said semiconductor component during the etching event, is avoided;

c) implementing an etching event at the semiconductor component;

d) eliminating water vapor that arises as a reaction product during the etching through the gas outlet opening before occurrence of condensation and, simultaneously, admitting nitrogen into the chamber through the gas admission opening; and e) repeating steps b) through d) until the silicon is selectively removed at the semiconductor component, the semiconductor component being micromechanical function elements of aluminum are etched free.

11. A method for selective removal of $SiO_2$ relative to semiconductor materials and/or metal on semiconductor components, comprising the steps of:

a) placing a semiconductor component containing $SiO_2$ into a chamber having at least one gas admission opening and one gas outlet opening;

b) admitting, using controllable valves at the gas admission opening, dosed quantities of hydrogen fluoride gas and water vapor into the chamber, so that said gas and said water vapor proceed to the $SiO_2$ in said semiconductor component in a quantity sufficient for etching, quantities of said gas and said water vapor being limited such that condensation of the water vapor, that forms liquid water on said semiconductor component during the etching event, is avoided, said controllable valves having mass flowmeters, and electronically regulating gas quantities flowing through said valves;

c) implementing an etching event at the semiconductor component;

d) eliminating water vapor that arises as a reaction product during the etching of the semiconductor component through the gas outlet opening before occurrence of condensation and, simultaneously, admitting an inert gas into the chamber through the gas admission opening; and e) repeating steps b) through d) until the $SiO_2$ is selectively removed, movable micromechanical function elements of polysilicon thereby being etched free.

12. The method according to claim 11, wherein nitrogen is employed as the inert gas in step d).

13. A method for selective removal of $SiO_2$ relative to semiconductor materials and/or metal on semiconductor components, comprising the steps of:

a) placing a semiconductor component containing $SiO_2$ into a chamber having at least one gas admission opening and one gas outlet opening;

b) admitting, using controllable valves at the gas admission opening, dosed quantities of hydrogen fluoride gas and water vapor into the chamber, so that said gas and said water vapor proceed to the $SiO_2$ in said semiconductor component in a quantity sufficient for etching, quantities of said gas and said water vapor being limited such that condensation of the water vapor, that forms liquid water on said semiconductor component during the etching event, is avoided, said controllable valves having mass flowmeters, and electronically regulating gas quantities flowing through said valves;

c) implementing an etching event at the semiconductor component;

d) eliminating water vapor that arises as a reaction product during the etching of the semiconductor component through the gas outlet opening before occurrence of condensation and, simultaneously, admitting an inert gas into the chamber through the gas admission opening; and e) repeating steps b) through d) until the $SiO_2$ is selectively removed, micromechanical function elements of aluminum are etched free.

14. The method according to claim 13, wherein nitrogen is employed as the inert gas in step d).

* * * * *